United States Patent
Bornemann et al.

(10) Patent No.: US 6,258,753 B1
(45) Date of Patent: Jul. 10, 2001

(54) PROCESS FOR PRODUCING OPTIMIZED MELT-TEXTURED BODIES BASED ON THE HIGH-TEMPERATURE SUPERCONDUCTOR $YBA_2CU_3O_7$ (YBCO)

(75) Inventors: Hans-Jurgen Bornemann, Calw; Thomas Burghardt, Engelbrand; Wolfgang Hennig, Karlsruhe, all of (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 0 days.

(21) Appl. No.: 09/105,118

(22) Filed: Jun. 17, 1998

Related U.S. Application Data

(63) Continuation-in-part of application No. PCT/EP96/05234, filed on Nov. 27, 1996.

(30) Foreign Application Priority Data

Jan. 19, 1996 (DE) ................................. 196 01 771

(51) Int. Cl.[7] ........................ H01L 39/24; C04B 35/653
(52) U.S. Cl. .................. 505/450; 505/166; 505/733; 505/739; 505/500; 505/781
(58) Field of Search ...................... 505/166, 450, 505/733, 781, 739, 500; 427/62; 252/521

(56) References Cited

U.S. PATENT DOCUMENTS

| 5,591,698 | * | 1/1997 | Song et al. ................ 505/450 |
| 5,846,912 | * | 12/1998 | Selvamanickam et al. ........ 505/450 |

FOREIGN PATENT DOCUMENTS

| 43 24 088 | 1/1995 | (DE) . |
| 0 517 469 | 12/1992 | (EP) . |
| 0 537 363 | 4/1993 | (EP) . |

OTHER PUBLICATIONS

V. Selvamanickam et al., "Control Of Grain Alignment To Fabricate Long Y–Ba–Cu–O Superconductors With High Current Density", *Applied Physics Letters*, 60(26), Jun. 1992, pp. 3313–3315.

\* cited by examiner

*Primary Examiner*—Roy V. King
(74) *Attorney, Agent, or Firm*—Klaus J. Bach

(57) ABSTRACT

The invention concerns a process for producing optimized melt-textured volume samples based on the high temperature superconductor $YBa_2Cu_3O_7$ (YBCO) for use in contact-free self-stabilizing magnetic bearings. The object of the invention is to provide a process by which structured high-temperature superconductive materials of the initially mentioned composition can be mass-produced economically in an automated process while maintaining a high degree of dimensional accuracy.

3 Claims, 4 Drawing Sheets

PROCESS FOR PRODUCING OPTIMIZED MELT-TEXTURED BODIES BASED ON THE HIGH-TEMPERATURE SUPERCONDUCTOR YBA$_2$CU$_3$O$_7$ (YBCO)

This is a continuation-in-part application of International Application PCT/EP96/05234 filed Nov. 27, 1996 and claiming the priority of German application 196 01 771.8 filed Jan. 19, 1996.

BACKGROUND OF THE INVENTION

The present invention resides in a process for producing optimized melt-textured volume samples on the basis of the high-temperature superconductor YBa$_2$Cu$_3$O$_7$ (YBCO) for use in contact-free self-stabilizing magnetic bearings.

Such bearings generate no friction and are not subject to the wear of parts moving relative to each other since the support surfaces are not in contact with the supported surfaces during operation. Accordingly, many of the operational problems associated with bearings presently in use are eliminated. Superconductor magnetic bearings are furthermore self-stabilizing and accordingly do not require expensive electronic control equipment for this purpose. In comparison with conventional magnetic bearings, they are substantially more simple in their design and less expensive.

For the intended application, there are various requirements as to the material. With the special technique of melt structuring, a building component can be generated which is particularly suitable for use in bearings. It provides for high levitation forces and, at the same time, for a high bearing stability.

With a certain texture with large textured areas (graina size >3 cm), the superconductive properties can be so influenced that the magnetic fields are frozen during operation whereby the desired properties can be easily obtained. Microstructural defects result in an effective anchoring of the magnetic flux what is known under the term pinning and provide for excellent stabilization properties of the bearing. because of the anisotrophy of the critical currents of the high temperature superconductor YBCO, the orientation of the c axis parallel to the external magnetic field is important for achieving a high levitation force.

A basic requirement for a technical application, however, has not been fulfilled at this time, that is, the possibility to manufacture the bearing components economically with acceptable reject numbers. Only if this condition is fulfilled such bearings will be commercially utilized and installed in extremely fast running rotors such as turbomolecular pumps or flywheel energy storage devices in an efficient manner.

DE 42 43 053 A1 discloses a method for the manufacture of voluminous oxide superconductors by a three-dimensional arrangement of layers REBa$_2$CU$_3$O$_7$. RE is any rare earth element. The method comprises a plurality of extensive and tedious handling steps such as the manufacture of intermediate molding bodies and multiple heating and cooling steps, and it utilizes in addition to Y various rare earth elements some of which are substantially more rare than Y.

The method is suitable to provide good end products but is not suitable to provide for an economical automated industrial production.

EP 0 486 698 A1 also describes a method of producing single crystal pellets by a layer arrangement of RE 123 phases in a particular order as described already in DE 42 43 053 A1.

Methods of producing such superconductors exist also in the US and in Japan.

U.S. Pat. No. 4,990,493 discloses a method of producing a polycrystalline superconductor on the basis of the compound Y-123 in which the single particles are al oriented. However, even with such an orientation, polycrystalline Y-123 is not suitable for levitation applications since the critical current, herein also called "intragrain-" or "intergrain current" is limited to the individual particles. These bodies a size at best in the range of 100 $\mu$m. As a result, the integral current density averaged over the whole pellet is much too small for generating a levitation as needed for practical applications.

In the USA, a gradient process is preferred (see V. Selvamanickam et al., Appl. Phys. Lett. 60(1992) 3313–3315). In this process, the superconductive material is melted in a gradient furnace and is textured. This method provides for materials with good superconductive properties which generate high levitation forces and sufficient bearing stability but an industrial production has still not become economically feasible. Altogether, the process is a very time consuming expensive and complicated process in which the following conditions need to be observed:

the temperature gradient needs to be accurately adjustable. This requires expensive furnaces with complicated electronic controls.

Each time only one sample can be textured at a time with temperature gradienting.

Up to now, only relatively small samples (<3 cm) have been manufactured since commercially available gradienting furnaces have a relatively small-diameter oven cavity.

The necessary reproducibility could not be achieved so far, that is with this melting and texturing process a relatively large amount of rejects is produced.

The melt-powder-melt growth process (MPMG) (U.S. Pat. No. 5,395,820) favored in Japan provides relatively good materials, but is industrially unfeasible because of unachievable economical conditions. In this Japanese process, compressed blanks are first melted at very high temperatures (about 1400° C.) and are quenched before the actual melt texturing process begins. This requires a labor intensive manufacturing step for which expensive equipment for the quenching of the about 1400° C. hot melt is needed. At this point, it is not clear how this process can be automated.

Accordingly, it is the object of the present invention to provide a method, whereby high temperature superconductor materials of the composition given above can be manufactured by an automated process in large numbers in an economical manner.

SUMMARY OF THE INVENTION

The process according to the invention for producing optimized melt-textured bodies on the basis of the high temperatures superconductor YBa$_2$Cu$_3$O$_7$ (YBCO) for use in contact-free self-stabilizing magnetic bearings, comprising the following steps:

a) preparations of the base material: providing a commercially available powder of the compounds YBa$_2$Cu$_3$O$_{7-x}$, Y$_2$O$_3$ and PtO$_2$ being ground in such a way that the YBa$_2$Cu$_3$O$_{7-x}$ powder has a grain size in the range of d=10±2 $\mu$m, whereby it has a specific surface of about 1±0.2m$^2$/g, with an oxygen content of x<0.2% and a foreign phase content of <1%, a carbon content of at most 2000 ppm and a transition metal content of together at most 2000 ppm, the $Y_2O_3$ powder has a grain size of about d=4.5 $\mu$m, and the $PtO_2$ powder has a grain size of about d=60 $\mu$m.

b) providing an amount suitable for the desired texturing by: processing the three powders for an optimal texturing process in stoichiometric parts according to the compound $YBa_2Cu_3O_{7-x}$+0.35 mol % $Y_2O_3$+0.1 wt % $PtO_2$ and mixing the compounds in a ball mill for a predetermined period limited by a certain $CO_2$ absorption, or under an inert atmosphere until a uniform mixing state has been achieved, pressing the mixed powder uni-axially into a mold and subjecting it to a high pressure of at least 300 bar to form densified blanks of a predetermined shape, covering the surfaces of the blanks with a contamination protective cover and further densifying the blanks in a cold isostatic compression step under at least 3000 bar whereby the powder particles come into close contact with one another, and c) subjecting the blanks to a temperature treatment: by heating the blanks from ambient temperature to 600° C. in 1.5 hrs, then heating the blanks from 600° C. to 1100° C. in 1.6 hrs, and maintaining the blanks at this temperature for about ½ hr, then reducing the temperature at a rate of 300° C./hr to a temperature of 1040° C. for about 85 hrs; then reducing the temperatures at a rate of about 5° C./hr from 930° C. to 850° C. and then increasing the cool down speed to 50° C./hr until a temperature of 450–400° C. is reached, then flushing the crucible with oxygen and maintaining this temperature for at least 80 hrs and finally cooling down to ambient temperature at a rate of about, 100° C./hr.

The process is quite simple and fast as far as such thermal processes are concerned and has good potential for automatization. The process has good reproduceability and provides materials with superconductive properties with which during operation the required forces and force field configurations can be generated with the necessary quality. By the special seeding procedure, it is possible, in principle, to obtain any desired texture or a desired combination of preferred directions in the samples and to remove the seed from the melt-texture superconductor without destroying it after the thermal treatment for repeated use. Increasing the production number is easily possible for example by operating ovens in parallel, the samples being textured in the ovens concurrently.

A final essential manufacturing step resides in the exchange of the atmosphere in the oven or the flushing of the oven interior with oxygen and staying the temperature over a predetermined period of time before the final cool down to ambient temperature. In this way, a complete oxidation is achieved in the shortest time.

Samples manufactured with this method have been successfully utilized in various superconductive bearings. Such a bearing has been tested, for example, in an energy storage device. This energy storage device was relatively small with an energy capacity of 5 Wh and a power output of 1 kVA. Samples for a larger energy storage device (300 Wh, 10 kVA) are being installed in connection with regenerative energy generators such as wind energy generators and photovoltaic devices.

For a friction-free support in a rotation disc vacuum sensor, a bearing using the YBCO samples manufactured in accordance with the invention was installed with which the lowest friction for any superconductive magnetic bearing has been achieved. The friction coefficient was $\mu$=1.6×10$^{-9}$. Since the materials so produced have the capability of anchoring magnetic flux, they can be used as superconductive permanent magnets. The materials are much more capable than any of the best conventional permanent magnets. They can also be used as high performance magnets for compact powerful DC current motors or for providing magnetic fields, or in medical nuclear spin resonance procedures.

With their capability of anchoring the magnetic flux, the materials can transport high electric currents. They can therefore be used in electric power supplies as the power supply devices for cryosystems.

Below the melting process according to the invention will be described in greater detail utilizing a temperature diagram. The figures facilitate the understanding of the process and the results achieved thereby.

DESCRIPTION OF A PREFERRED EMBODIMENT

The temperature distribution in accordance with the temperature time diagram according to the invention, has been found to be the optimum with respect to the time and the high reproducibility for the manufacture of the melt textures.

Into an isothermal oven with a cube-like heating chamber, wherein only the four sides are heated and whose dimensions, which are 150×150×150 mm$^3$ (L×W×H) are substantially greater than those of the pellets, pellets of $Al_2O_3$ rods are placed and subjected to the thermal process. This process starts with a first heating step from ambient temperature to 600° C. in one and a half hours. Then the temperature is increased at a slower rate as the temperature is further increased to 1100° C. in 1.6 hours. This heating phase must be performed relatively fast in order to keep the oxygen loss in the pellets at a minimum.

The heating phase is followed by a short period in which the temperature is maintained constant. It is important that during the transition to this phase the temperature over shot is not greater than 10° C. over the end temperature of the last slower heating phase. At this temperature level, there is the peritectic phase wherein the pellet is in a two-phase state, that is, in a solid and a liquid state.

After termination of the constant temperature period, the temperature is lowered at a rate of 300° C./h. When a temperature of 1040° C. is reached a seed crystal is placed onto the pellet in order to induce the crystallization process. The cooling step continues until a temperature of 1015° C. is reached.

When the temperature of 1015° C. has been reached the cooling phase continues, however, at a much smaller rate, that is, at only 1° C./h. In this phase occurs the grain growth which lasts for about 85 hours. Then the temperature is reduced at a greater rate of 5° C./hr from 930° C. to 850° C. During this relatively rapid cool-down period, the reaction in the remaining melt occurs. At 850° C., this reaction is completed. The cooldown speed is now increased to 50° C./hr until 450–400° C. are reached.

Then the temperature is maintained constant and the oven whose atmosphere up to this point has been air is flushed with pure oxygen. The pellet is therefore charged with oxygen. This second constant temperature level is maintained for at least 80 hrs. 100 hrs have been found to be the optimum time for this phase.

The final temperature decrease at a rate of about 100° C./hr to room temperature completes the heat treatment or melt texturing process.

Figure 1:
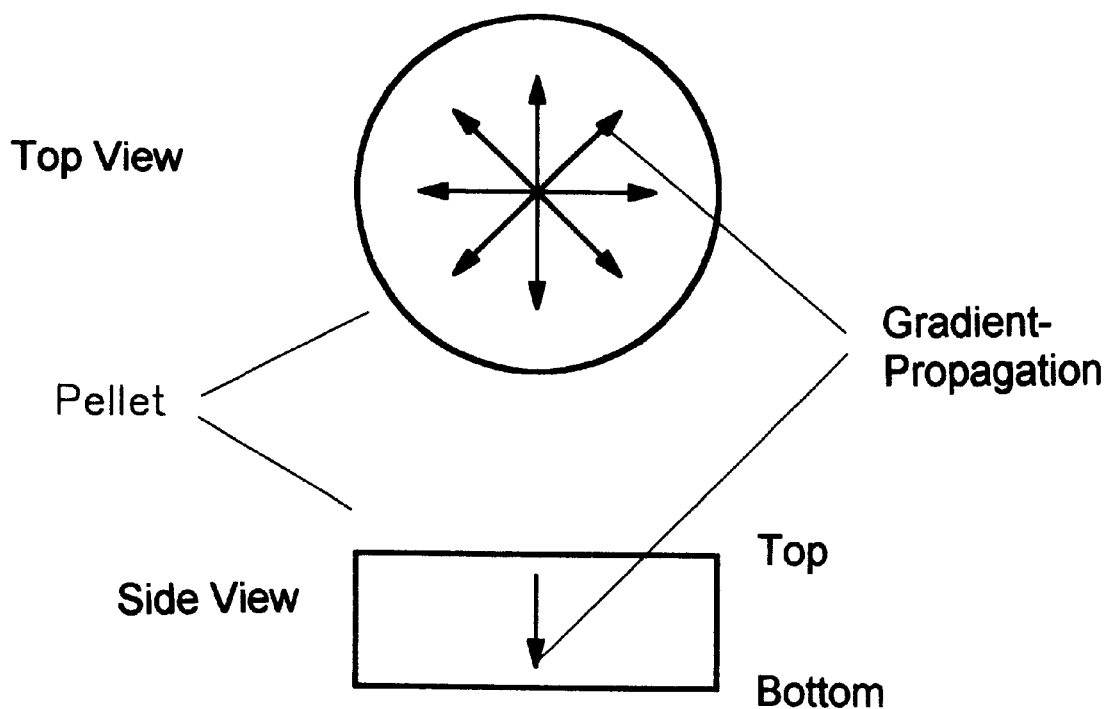
FIG. 1 shows the growth direction of the solidifying phase.

With the melt texturing process, a radial rotation symmetrical temperature gradient is established. This gradient is superimposed by another (smaller) temperature gradient in the direction of the cylinder axis (c-axis) of the pellet. The crystallization occurs from the center of the top side radially outwardly and toward the interior of the pellets as schematically indicated in FIG. 1. The top side of the pellet is always the best-structured surface of the pellet. The orientation is initiated by the seed crystal in such a way that the c-axis is parallel to the cylinder axis of the pellet. However, the c-axis may be oriented differently depending on the orientation of the seed crystal.

With this melt texturing process, the seed crystals, which are planted at the seed temperature of 1040° C., must have an edge length normal to the c-axis >2 mm and the ratio edge length to height must be >2. The height should be at least 1 mm.

The oven chamber has four side walls, which are heated. In order to prevent contamination of the samples by a reaction with the crucible material, the samples are placed on rods of aluminum oxide as mentioned earlier. The rods are for example about 100 mm long and have a diameter of about 4 mm. In this way, the contacted surface areas of the pellets are at a minimum.

The seeding with the seed crystal begins during the texturing process at 1040° C. as described earlier. To this end, the oven lid is opened and a seed crystal is planted from the top onto the still soft sample. It is important that the seed crystal is not in place on the sample already at the start that is already during the heat-up period, but is placed onto the sample only during the cool-down procedure upon reaching 1040° C., which is the seeding temperature.

Otherwise, the seed crystal would be partially dissolved since it would be heated above its melting temperature.

The seed crystals must be structurally similar to the YBCO and furthermore, they must have a higher melting point. They are produced in a separate texturing process from commercially available powders based on the following start out mixture:

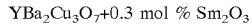

$YBa_2Cu_3O_7 + 0.3$ mol % $Sm_2O_3$

With this process small samples with a diameter of 20 mm are produced. They are treated by the same temperature program with the modification, however, that the highest temperature is 1150° C. and the first slow cool down process starts at 1060° C. the atmosphere used during the melt texturing procedure is air. Seed crystals can also be produced in an inert gas atmosphere such as argon. The initial mixture for the seed crystals is

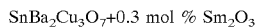

$SnBa_2Cu_3O_7 + 0.3$ mol % $Sm_2O_3$

With this method particles of several mm diameter can be generated. Under a light microscope their orientations are determined and well-textured areas with the desired orientation are cut out with a diamond cutter for use as seed crystals.

Figure 2:
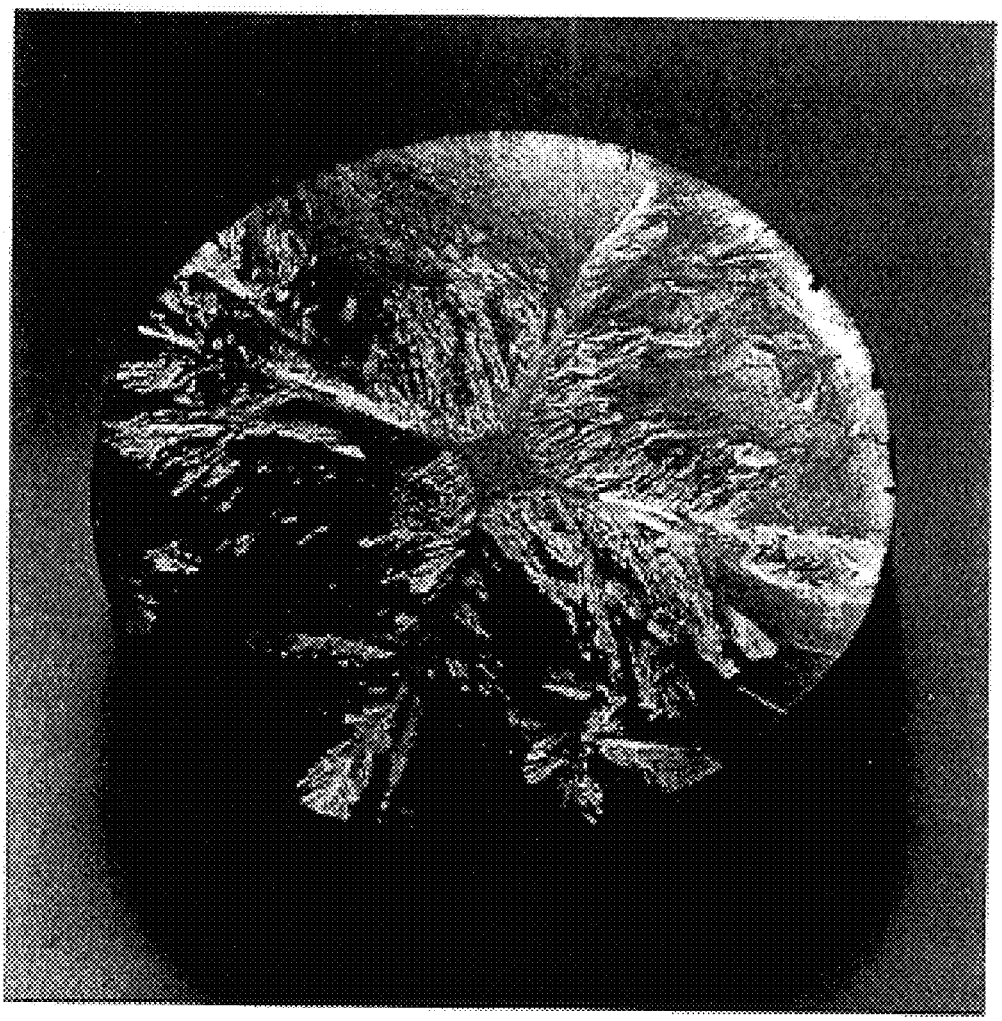
FIG. 2 shows a melt textured pellet according to the process.

FIG. 2 shows the surface structure of a cylindrical melt textured pellet of 40 mm diameter and 15 mm height. The figure is a copy of a photograph. The pellet consists of a seed having a c-axis parallel to the cylinder axis. The seed crystal is the small dark rectangle visible in the center of the pellet.

Figure 3:
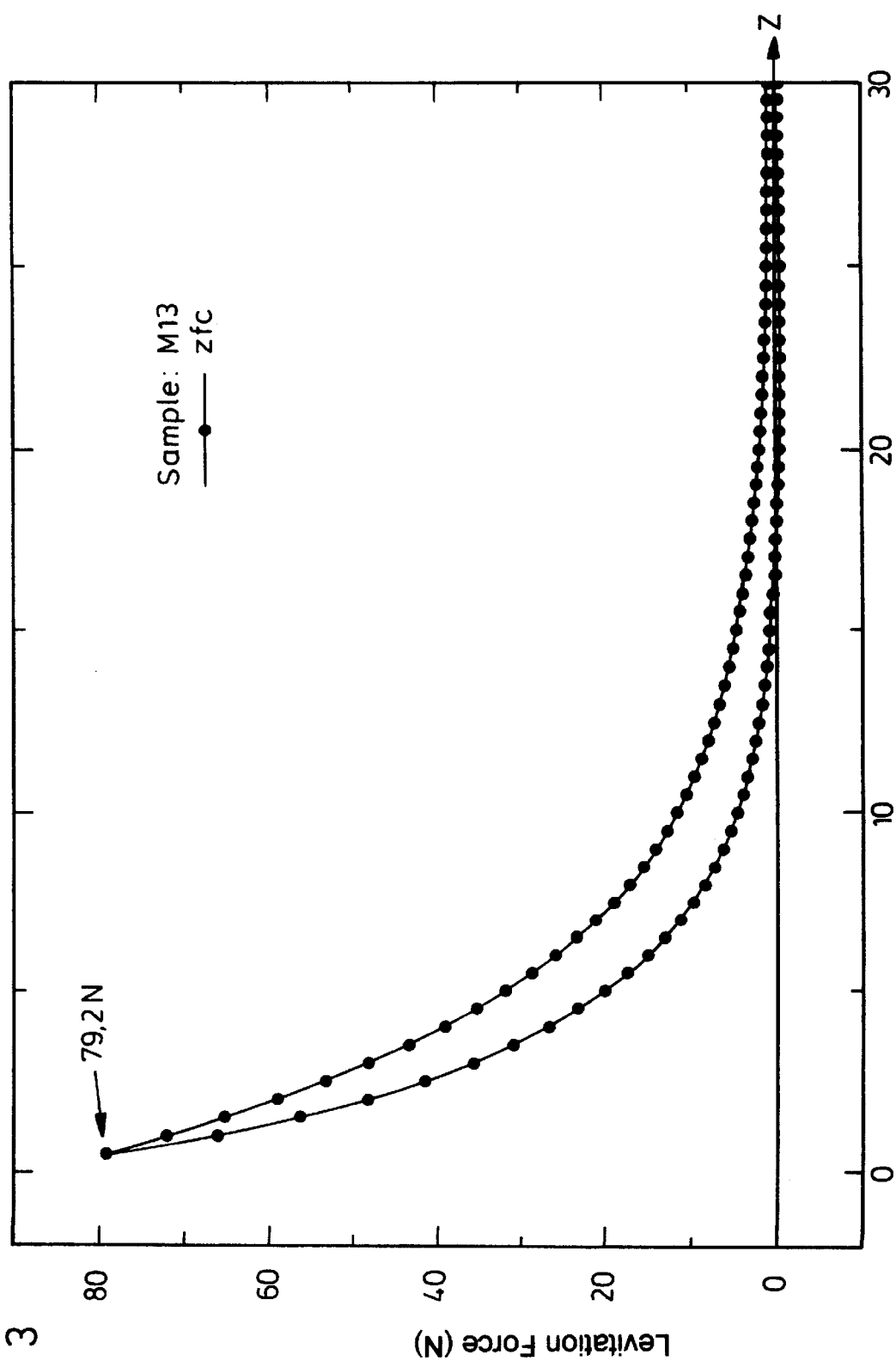
FIG. 3 shows the levitation force in the axial direction.
Figure 4:
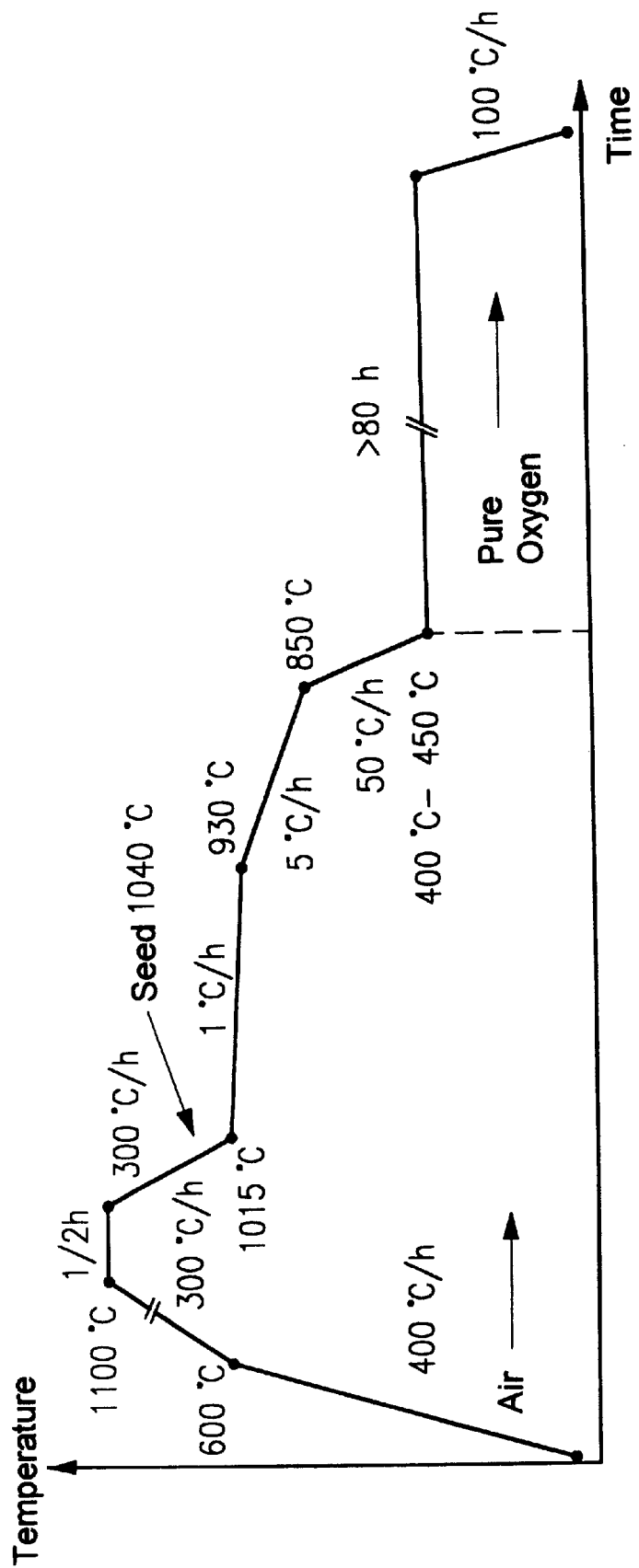
FIG. 4 shows the melt texturing procedure dependent on time.

It has been found that pellets which have been textured utilizing seed crystals have better levitation properties than samples made the conventional way. FIG. 3 shows the levitation forces depending on the axial distance (z axis) from the pellet. The level of levitation forces as indicated in FIG. 3 cannot be achieved with pellets made by conventional methods. FIG. 4 shows the melt texturing procedure dependent on time of the present invention.

What is claimed is:

1. A process for producing melt-textured bodies comprised of the high temperatures superconductor $YBa_2Cu_3O_7$ (YBCO) for use in contact-free self-stabilizing magnetic bearings, comprising the following steps:
    a) preparing a base material: providing a commercially available powder of compounds $YBa_2Cu_3O_{7-x}$, $Y_2O_3$ and $PtO_2$ being ground in such a way that the $YBa_2Cu_3O_7$ powder has a grain size in the range of $d=10+2$ μm, whereby it has a specific surface of about $1+0.2$ m$^2$/g, with an oxygen content of $x<0.2\%$ and a foreign phase content of <1%, a carbon content of at most 2000 ppm and a transition metal content of together at most 2000 ppm, the $Y_2O_3$ powder has a grain size of about $d+4.5$ μm, and the $PtO_2$ powder has a grain size of about $d=60$ μm,
    b) providing an amount suitable for desired texturing by: processing the three powders for a texturing process in stoichiometric parts according to the compounds $YBa_2Cu_3O_7 + 0.35$ mol % $Y_2O_3 + 0.1$ wt % $PtO_2$ and mixing the compounds in a ball mill for a predetermined period limited by a $CO_2$ absorption, or under an inert atmosphere until a uniform mixing state has been achieved, pressing the mixed powder uni-axially into a mold and subjecting it to a high pressure of at least 300 bar to form densified blanks of a predetermined shape, covering the surfaces of the blanks with a contamination protective cover and further densifying the blanks in a cold isostatic compression step under at least 3000 bar whereby the powder particles come into close contact with one another, and
    c) subjecting the blanks to a temperature treatment: by heating the blanks in a crucible from ambient temperature to 600° C. in 1.5 hrs, then heating the blanks from 600° C. to 1100° C. in 1.6 hrs, and maintaining the blanks at this temperature for about ½ hr, then reducing the temperature at a rate of 300° C./hr to a temperature of 1040° C. for about 85 hrs; then reducing the temperatures at a rate of about 5° C./hr from 930° C. to 850° C. and then increasing the cool down speed to 50° C./hr until a temperature of 450–400° C. is reached, then flushing the crucible with oxygen and maintaining this temperature for at least 80 hrs and finally cooling down to ambient temperature at a rate of about, 100° C./hr.

2. A method according to claim 1, wherein for the orientation of the texture in the c-axis that is in the cylinder axis of the blanks, the shape of the blanks is defined by the ratio cylinder diameter to cylinder height >2 and the height is limited to <25 mm.

3. A method according to claim 2, wherein for the high densifying process said blanks are each enclosed in a foil and the isostatic densification takes place in a compressible oil or incompressible water.

* * * * *